United States Patent
Baker et al.

(10) Patent No.: US 6,497,465 B1
(45) Date of Patent: Dec. 24, 2002

(54) ANTI-TILT MECHANISM FOR A DRAWER ASSEMBLY

(75) Inventors: Bruce E. Baker, Round Rock, TX (US); John S. Corbin, Austin, TX (US); Philip W. Sobey, Georgetown, TX (US)

(73) Assignee: International Business Machines Corporation, Armonk, NY (US)

( * ) Notice: Subject to any disclaimer, the term of this patent is extended or adjusted under 35 U.S.C. 154(b) by 63 days.

(21) Appl. No.: 09/666,276

(22) Filed: Sep. 21, 2000

(51) Int. Cl.[7] .............................................. A47B 88/04
(52) U.S. Cl. ................................. 312/334.4; 312/223.1
(58) Field of Search .............................. 312/330.1, 333, 312/257.1, 265.1, 322, 323, 334.4, 334.5, 334.7, 334.8, 334.1; 248/235, 247, 250; 211/26, 189

(56) References Cited

U.S. PATENT DOCUMENTS

| | | | |
|---|---|---|---|
| 2,356,650 A | | 8/1944 | Bullock |
| 2,937,765 A | * | 5/1960 | Shank ................. 312/334.8 X |
| 3,133,768 A | * | 5/1964 | Klakovich ........... 312/334.8 X |
| 3,544,186 A | | 12/1970 | Bjorge |
| 4,193,649 A | | 3/1980 | Sharon ......................... 384/19 |
| 5,833,337 A | * | 11/1998 | Kofstad ............... 312/334.8 X |
| 5,941,621 A | * | 8/1999 | Boulay et al. ........... 312/334.4 |
| 6,070,957 A | * | 6/2000 | Zachrai ................... 312/334.4 |
| 6,142,590 A | * | 11/2000 | Harwell ............... 312/334.8 X |

* cited by examiner

Primary Examiner—James O. Hansen
(74) Attorney, Agent, or Firm—Sawyer Law Group LLP

(57) ABSTRACT

An anti-tilt mechanism for a drawer assembly, the drawer assembly being in a rack, is disclosed. The anti-tilt mechanism comprises two railing portions coupled to the rack and two brackets, each of the two brackets respectively coupled to one of the two railing portions. Each of the. two brackets comprises a first planar portion and a second planar portion, the second planar portion coupled to the top of the first planar portion and extending substantially perpendicular to the first planar portion, the second planar portion capable of preventing the drawer assembly from tilting during a slidable operation thereof. The anti-tilt mechanism in accordance with the present invention prevents the drawer assembly from tilting during the slidable operation of the assembly. This is desirable because if tilting occurs during the slidable operation of the assembly, the assembly could be damaged and/or a system operator could be injured.

9 Claims, 7 Drawing Sheets

ANTI-TILT MECHANISM FOR A DRAWER ASSEMBLY

FIELD OF INVENTION

The present invention relates generally to drawer assemblies and more specifically to an anti-tilt mechanism for a drawer assembly.

BACKGROUND OF THE INVENTION

Computer drawer assemblies are typically utilized throughout the computer industry. FIG. 1(a) shows a conventional drawer assembly configuration. The configuration comprises a first railing portion 10 and a second railing portion (not shown) directly opposite the first railing portion 10. The railing portions are coupled to a rack 12 wherein a drawer assembly 14 is slidably mounted within the railing portions and withdrawn as desired in order to service a computer system, check computer system parameters, etc.

A problem occurs however when the drawer assembly 14 is withdrawn from the rack 12. When the drawer assembly 14 is withdrawn from the rack 12, gravitational forces cause the drawer assembly 14 to tilt in a downward direction. For an illustration, please refer now to FIG. 1(b). FIG. 1(b) shows the conventional drawer assembly configuration wherein the drawer assembly 14 has tilted due to the slidable operation thereof. This phenomenon could potentially cause injury to the system operator or to a bystander or damage the drawer assembly 14.

Accordingly, what is needed is a drawer assembly configuration that prevents the computer system from tilting due to the slidable operation thereof. The assembly should be simple, cost effective and capable of being easily adapted to current technology. The present invention addresses such a need.

SUMMARY OF THE INVENTION

An anti-tilt mechanism for a drawer assembly, the drawer assembly being in a rack, is disclosed. The anti-tilt mechanism comprises two railing portions coupled to the rack and two brackets, each of the two brackets respectively coupled to one of the two railing portions. Each of the two brackets comprises a first planar portion and a second planar portion, the second planar portion coupled to the top of the first planar portion and extending substantially perpendicular to the first planar portion, the second planar portion capable of preventing the computer system from tilting during a slidable operation thereof.

The anti-tilt mechanism in accordance with the present invention prevents the drawer assembly from tilting during the slidable operation of the assembly. This is desirable because if tilting occurs during the slidable operation of the assembly, the assembly could be damaged and/or a system operator could be injured.

DETAILED DESCRIPTION OF THE INVENTION

The present invention provides an anti-tilt mechanism for a drawer assembly.. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiments shown but is to be accorded the widest scope consistent with the principles and features described herein.

The present invention is presented in the context of a preferred embodiment. The preferred embodiment of the present invention is an anti-tilt mechanism for a computer drawer assembly. The anti-tilt mechanism in accordance with the present invention prevents the drawer assembly from tilting during the slidable operation of the assembly. This is desirable because if tilting occurs during the slidable operation of the assembly, the assembly could be damaged and/or a system operator could be injured.

Figure 1A:
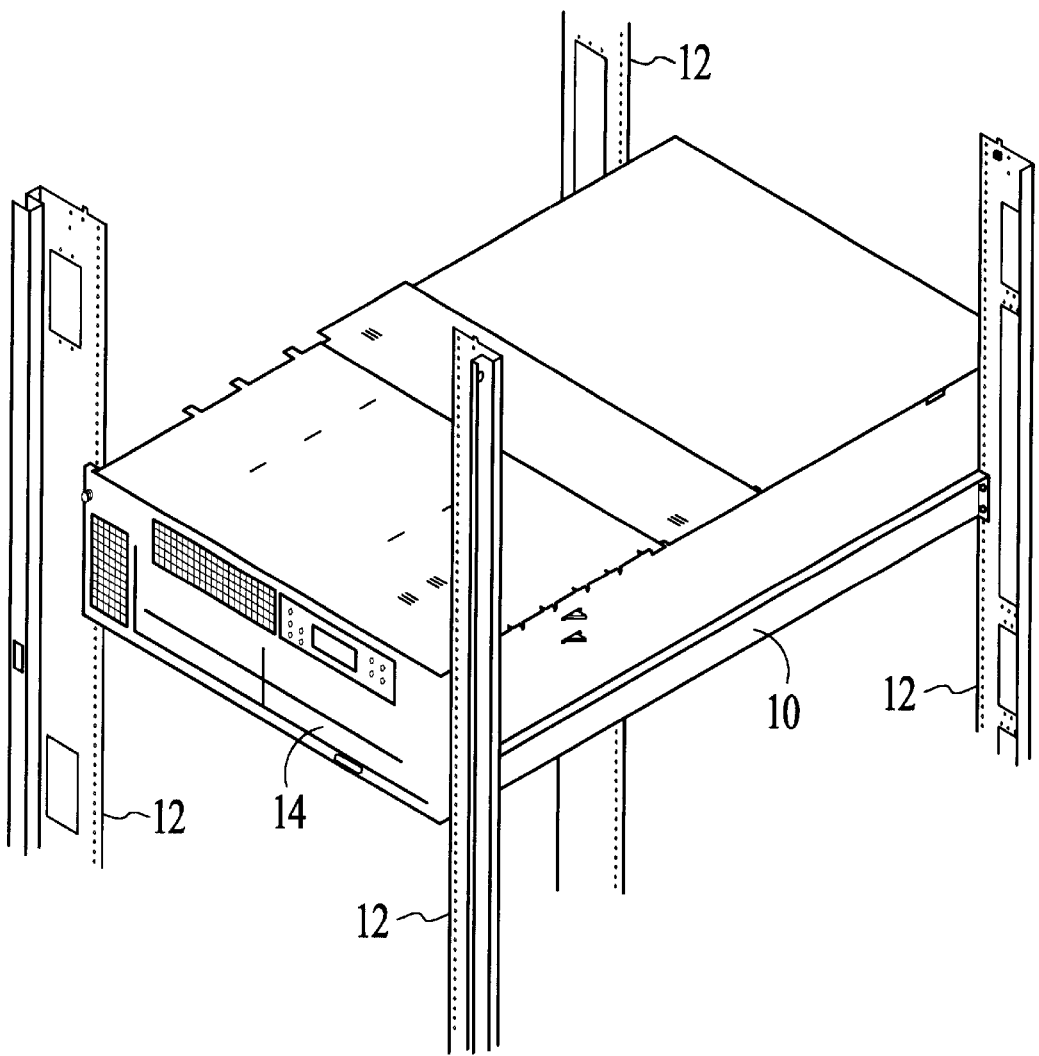
FIG. 1(a) shows a conventional drawer assembly configuration.
Figure 1B:
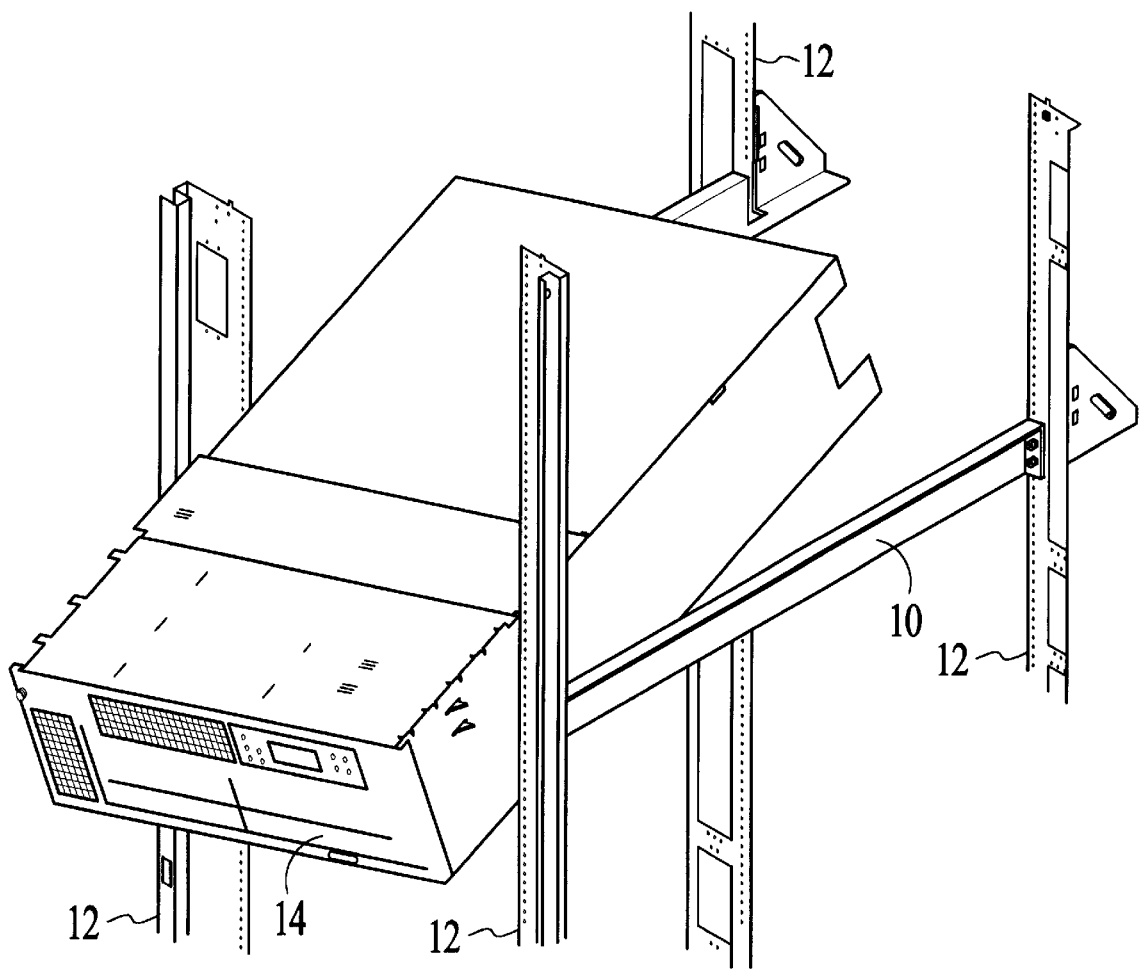
FIG. 1(b) shows the conventional drawer assembly configuration wherein the drawer assembly has tilted due to a slidable operation thereof.
Figure 2:
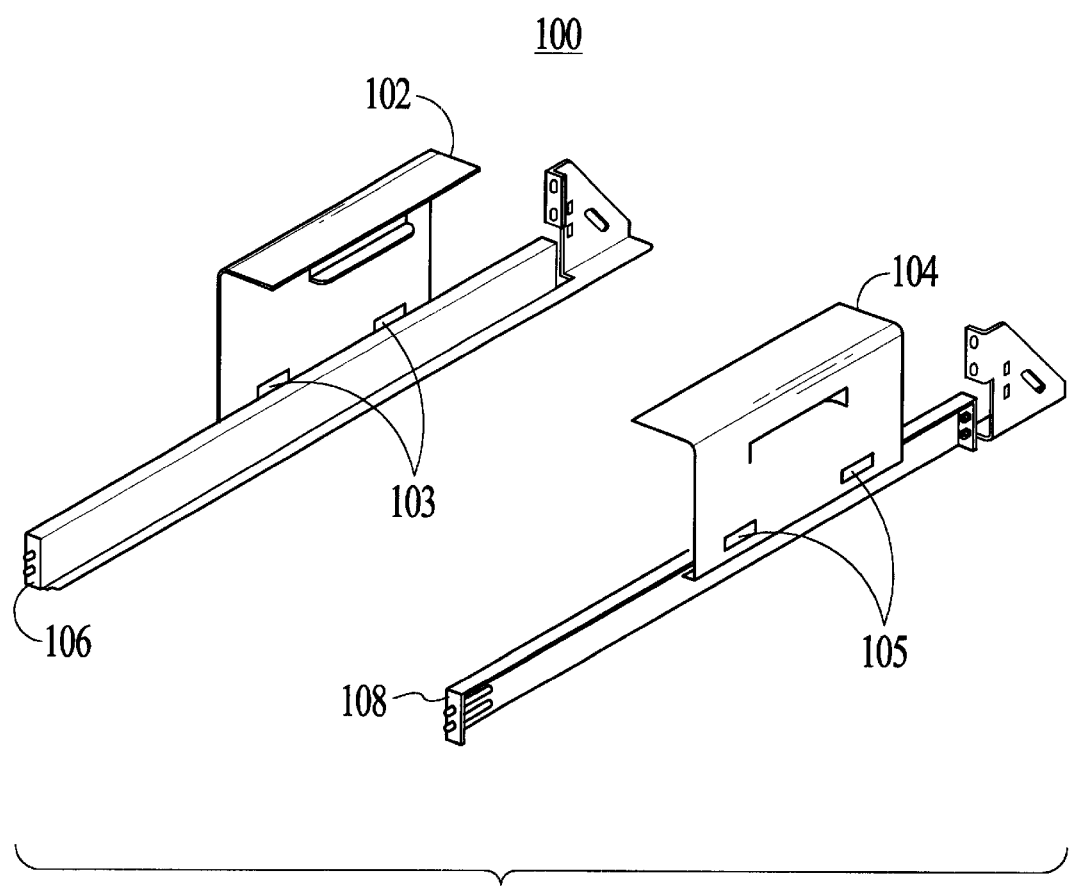
FIG. 2 shows an anti-tilt mechanism in accordance with the present invention.

FIG. 2 shows an anti-tilt mechanism 100 in accordance with the present invention. The mechanism 100 comprises first and second brackets 102, 104 and first and second railing portions 106, 108. Each of the two brackets 102, 104 is respectively coupled to one of the two railing portions 106, 108 via attachment means 103, 105. For example, the first bracket 102 is coupled to the first railing portion 106 via attachment elements 103 and the second bracket 104 is coupled to the second railing portion 108 via attachment elements 105. Preferably, the attachment elements 103, 105 comprise threaded screws or the like and the first and second railing portions 106, 108 are capable of being coupled to a computer rack (not shown).

Figure 3:
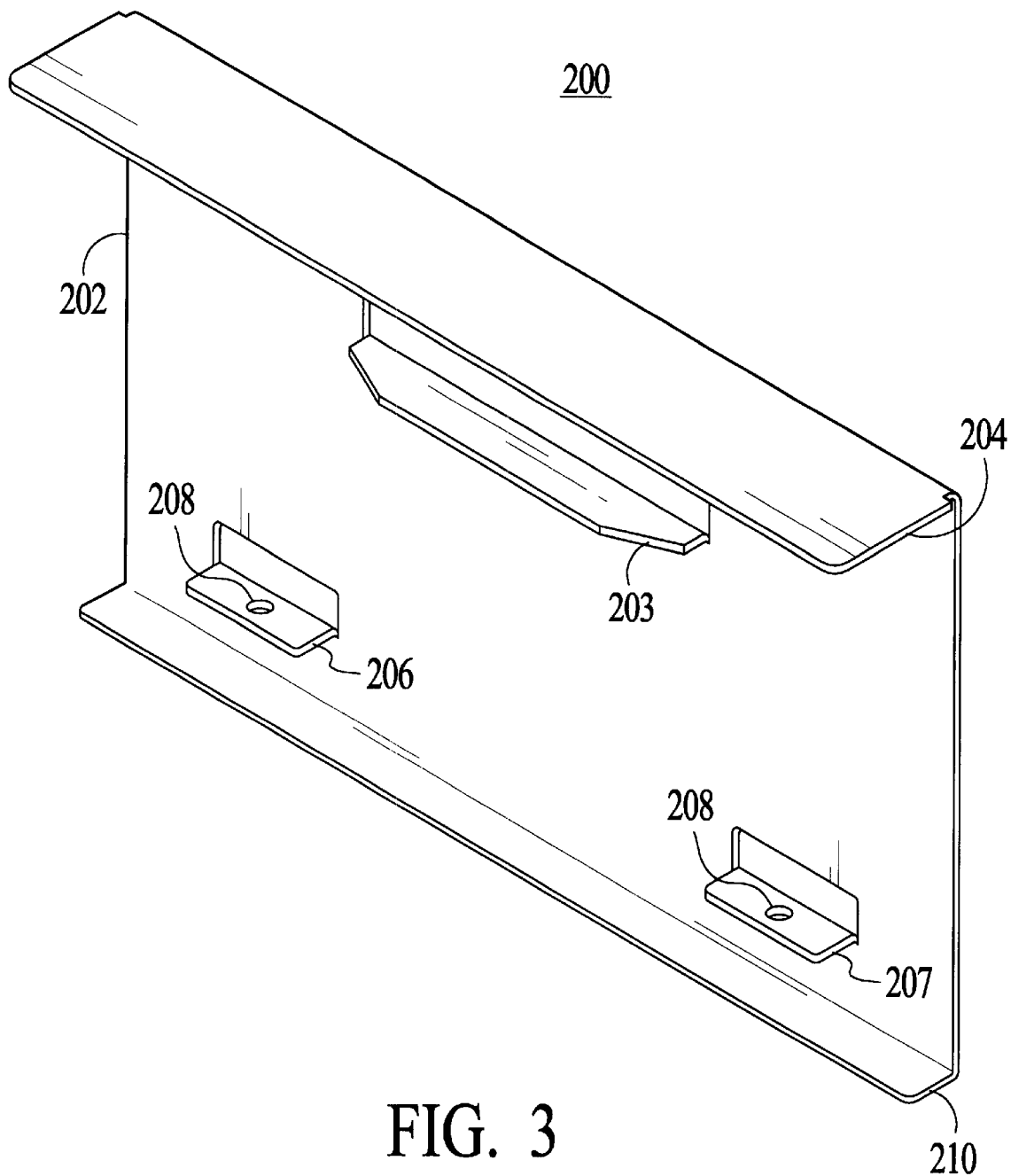
FIG. 3 shows a bracket in accordance with the present invention.

For a better understanding of the brackets, please refer now to FIG. 3. FIG. 3 shows a bracket 200 in accordance with the present invention. The bracket 200 comprises a first planar portion 202, a second planar portion 204, and a third planar portion 210. The second planar portion 204 is coupled to the top of the first planar portion 202 and extends substantially perpendicular to the first planar portion 202. The third planar portion 210 is coupled to the bottom of the first planar portion 202 and also extends substantially perpendicular to the first planar portion 202.

The first planar portion 202 also preferably includes two connecting portions 206, 207. The connecting portions 206, 207 are planar and extend substantially perpendicular to the first planar portion 202. The connecting portions 206, 207 are a predetermined distance apart and each connecting portion 206, 207 includes an opening 208 through which attachment means are utilized to couple the connecting portions 206, 207 to the railing portion.

The first planar portion 202 also includes a positioning portion 203. The positioning portion 203 is planar and extends substantially perpendicular to the first planar portion 202. The positioning portion 203 is designed to minimize the side-to-side movement of a drawer assembly contained within the mechanism in accordance with the present invention.

Figure 4:
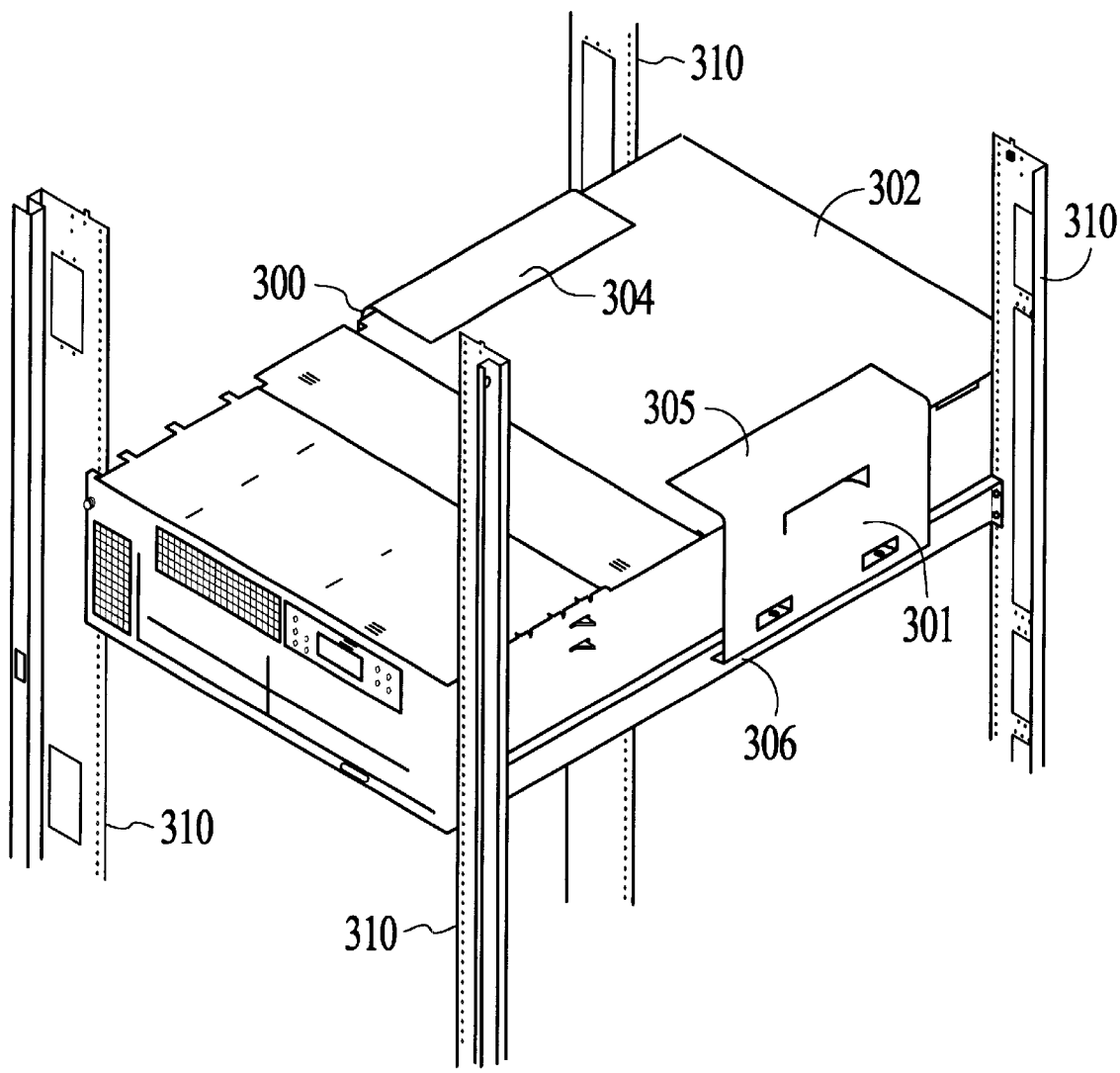
FIG. 4 shows an anti-tilt mechanism in accordance with the present invention wherein a drawer assembly is contained therein.

The second planar portion 204 is designed to extend over a portion of a top surface of a drawer assembly. For a better understanding, please refer to FIG. 4. FIG. 4 shows an anti-tilt mechanism 306 in accordance with the present invention wherein a drawer assembly 302 is contained therein. The anti-tilt mechanism 306 is coupled to a rack 310. Accordingly, the second planar portions 304, 305 of each of the brackets 300, 301 extend over the top surface 302 of the drawer assembly 302. Because the second planar portions 304, 305 of each of the brackets 300, 301 extend over a portion of the top surface 302 of the drawer assembly 302, the drawer assembly 302 is prevented from tilting during the slidable operation of the drawer assembly 302.

Figure 5:
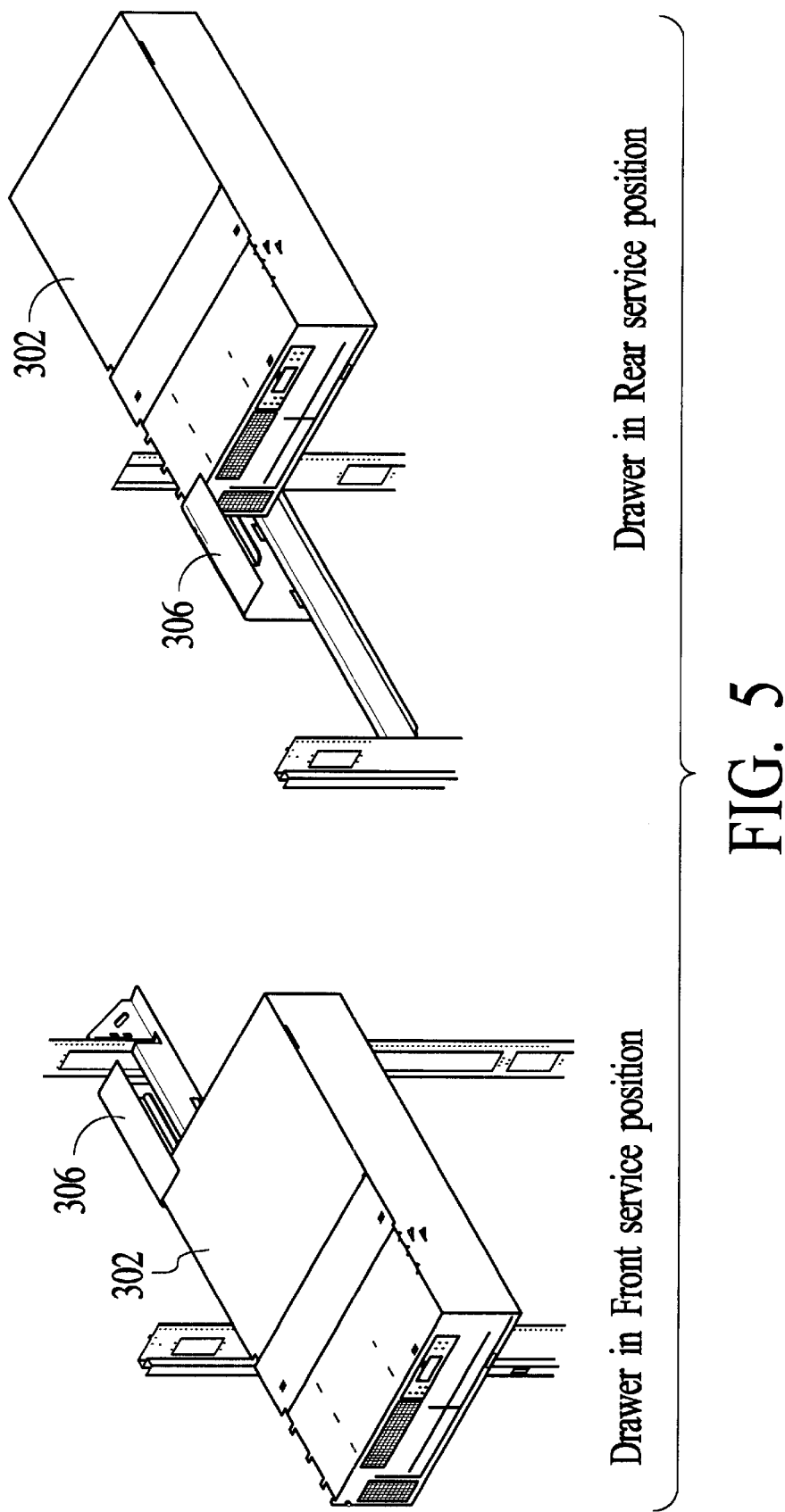
FIG. 5 shows the drawer assembly in both the front and rear service positions.

It should be further noted that the anti-tilt mechanism 306 in accordance with the present invention is designed to provide support to a drawer assembly 302 if the assembly is in either a front service position or a rear service position. FIG. 5 shows the drawer assembly 302 in both the front and rear service positions.

Figure 6:
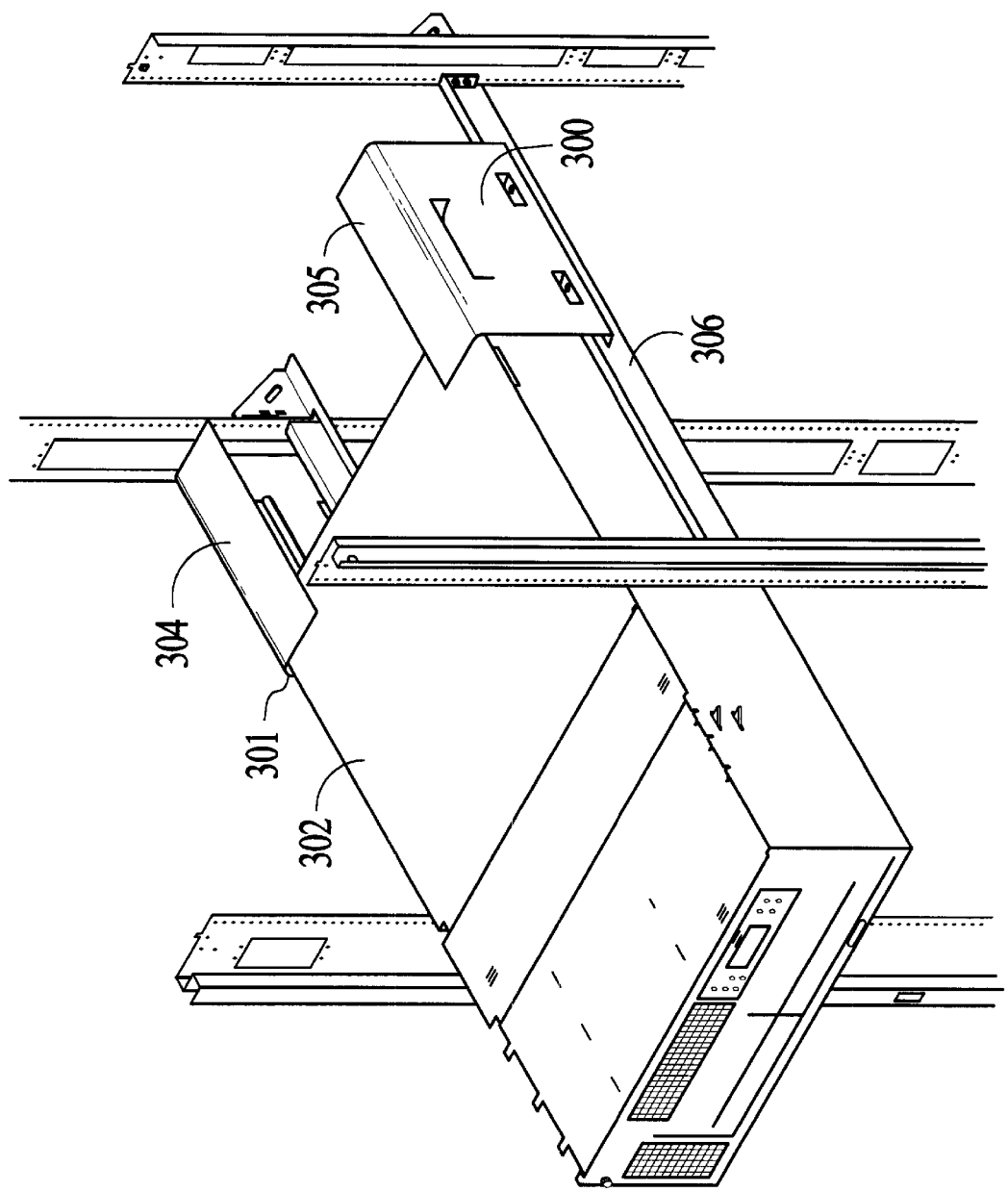
FIG. 6 shows an anti-tilt mechanism in accordance with the present invention after a slidable operation of the drawer assembly contained therein.

For a further illustration, please refer to FIG. 6. FIG. 6 shows an anti-tilt mechanism 306 in accordance with the present invention after a slidable operation of the drawer assembly 302 contained therein. Accordingly, since the second planar portions 304, 305 of each of the brackets 300, 301 extend over a portion of the top surface 302 of the drawer assembly 302, the drawer assembly 302 is prevented from tilting.

The present invention prevents a drawer assembly contained in a rack from tilting during a slidable operation of the assembly. This is desirable because if tilting occurs during the slidable operation of the drawer assembly, the assembly could be damaged and/or a system operator could be injured.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. An anti-tilt mechanism for a drawer assembly, the drawer assembly being in a rack, the anti-tilt mechanism comprising:

two railing portions coupled to the rack; and two brackets, each of the two brackets respectively coupled to one of the two railing portions, each of the two brackets comprising:

a first planar portion;

at least one connecting portion coupled to the first planar portion wherein the at least one connecting portion extends substantially perpendicular to the first planar portion and includes an opening through which an attachment element is utilized to couple the at least one connecting portion to the railing portion; and a second planar portion, the second planar portion coupled to the top of the first planar portion and extending substantially perpendicular to the first planar portion, the second planar portion capable of preventing the drawer assembly from tilting during a slidable operation thereof.

2. The mechanism of claim 1 wherein the attachment element comprises a threaded screw.

3. The mechanism of claim 1 wherein the first planar portion further comprises a positioning portion that extends substantially perpendicular to the first planar portion wherein the positioning portion minimizes the side-to-side movement of the drawer assembly.

4. The mechanism of claim 1 wherein the second planar portion is capable of extending over a portion of a top surface of the drawer assembly.

5. An anti-tilt mechanism for a drawer assembly, the drawer assembly being in a rack, the anti-tilt mechanism comprising:

two railing portions coupled to the rack; and two brackets, each of the two brackets respectively coupled to one of the two railing portions, each of the two brackets comprising:

a first planar portion;

at least one connecting portion coupled to the first planar portion wherein the at least one connecting portion extends substantially perpendicular to the first planar portion and includes an opening through which a threaded screw is utilized to couple the at least one connecting portion to the railing portion;

a positioning portion coupled to the first planar portion that extends substantially perpendicular to the first planar portion wherein the positioning portion minimizes the side-to-side movement of the drawer assembly; and a second planar portion, the second planar portion coupled to the top of the first planar portion and extending substantially perpendicular to the first planar portion, the second planar portion capable of extending over a portion of a top surface of the drawer assembly thereby preventing the drawer assembly from tilting during a slidable operation thereof.

6. An anti-tilt mechanism for a drawer assembly, the drawer assembly being in a rack, the anti-tilt mechanism comprising:

two railing portions coupled to the rack; and two brackets, each of the two brackets respectively coupled to one of the two railing portions, each of the two brackets comprising:

a first planar portion, wherein the first planar portion comprises at least one connecting portion for coupling the first planar portion to the railing portion wherein the at least one connecting portion extends substantially perpendicular to the first planar portion and includes an opening through which an attachment element is utilized to couple the at least one connecting portion to the railing portion; and a second planar portion, the second planar portion coupled to the top of the first planar portion and extending substantially perpendicular to the first planar portion, the second planar portion capable of preventing the drawer assembly from tilting during a slidable operation thereof.

7. The mechanism of claim 6 wherein the attachment element comprises a threaded screw.

8. The mechanism of claim 6 wherein the first planar portion further comprises a positioning portion that extends substantially perpendicular to the first planar portion wherein the positioning portion minimizes the side-to-side movement of the drawer assembly.

9. The mechanism of claim 6 wherein the second planar portion is capable of extending over a portion of a top surface of the drawer assembly.

* * * * *